US011947512B2

(12) United States Patent
Amundsen et al.

(10) Patent No.: US 11,947,512 B2
(45) Date of Patent: Apr. 2, 2024

(54) FEEDBACK-BASED INVERTED INDEX COMPRESSION

(71) Applicant: Microsoft Technology Licensing, LLC, Redmond, WA (US)

(72) Inventors: Torsten Amundsen, Tårnåsen (NO); Pavel Sukhov, Oslo (NO)

(73) Assignee: Microsoft Technology Licensing, LLC, Redmond, WA (US)

( * ) Notice: Subject to any disclaimer, the term of this patent is extended or adjusted under 35 U.S.C. 154(b) by 10 days.

(21) Appl. No.: 17/676,925

(22) Filed: Feb. 22, 2022

(65) Prior Publication Data

US 2023/0267108 A1 Aug. 24, 2023

(51) Int. Cl.
*G06F 16/00* (2019.01)
*G06F 16/22* (2019.01)
*G06F 16/31* (2019.01)
*H03M 7/30* (2006.01)

(52) U.S. Cl.
CPC ........ *G06F 16/2272* (2019.01); *G06F 16/319* (2019.01); *H03M 7/607* (2013.01)

(58) Field of Classification Search
CPC ........................... G06F 16/2272; G06F 16/319
USPC .................................................. 707/693, 742
See application file for complete search history.

(56) References Cited

U.S. PATENT DOCUMENTS

| 6,349,308 | B1 | 2/2002 | Whang et al. |
| 7,433,893 | B2 | 10/2008 | Lowry |
| 7,634,468 | B2 | 12/2009 | Stephan |
| 7,756,877 | B2 * | 7/2010 | Loofbourrow ........ G06F 16/319 |
| | | | 707/742 |
| 8,190,613 | B2 | 5/2012 | Takuma et al. |
| 8,190,614 | B2 | 5/2012 | Loofbourrow |
| 8,949,247 | B2 | 2/2015 | Torbjornsen |
| 2012/0221539 | A1 | 8/2012 | Rose et al. |

OTHER PUBLICATIONS

"Dynamic Inverted Indexes for a Distributed Full-Text Retrieval System"; By: Charles Clarke; Published: Feb. 1995 https://citeseerx.ist.psu.edu/document?repid=rep1&type=pdf&doi=98712336e9ec50b4bcead836d8d107f0ae4533a4.*
"Techniques for Inverted Index Compression": By: Giulio Ermanno; Published: Dec. 2020 https://dl.acm.org/doi/pdf/10.1145/3415148.*

(Continued)

*Primary Examiner* — Chelcie L Daye
(74) *Attorney, Agent, or Firm* — Novo TechIP International PLLC

(57) ABSTRACT

The disclosed technology is generally directed to the compression of inverted indexes. In one example of the technology, an inverted index that includes a plurality of posting lists and metadata is provided. The inverted index indicates compression settings that are associated with the plurality of posting lists. At periodic scheduled times, a regeneration is performed on the inverted index. The regeneration includes decompressing the inverted index. The decompressing uses the compression settings indicated by the inverted index. The regeneration further includes determining compression settings to use during a next periodic scheduled time of the plurality of periodic scheduled times, such that at least a first posting list of the plurality of posting lists uses a different compression setting than a second posting list of the plurality of posting lists.

20 Claims, 5 Drawing Sheets

(56) References Cited

OTHER PUBLICATIONS

"Dynamic Inverted Indexes for a Distributed Full-Text Retrieval System"; By: Charles Clark; Published 1995. https://citeseerx.ist.psu.edu/document?repid=rep1&type=pdf&doi=98712336e9ec50b4bcead836d8d107f0ae4533a4.*

"Techniques for Inverted Index Compression"; By: Giulio Ermanno Pibiri; Published 2020. https://dl.acm.org/doi/pdf/10.1145/3415148.*

"Compression of the Dictionary and Posting Lists Summary of Class Discussion—Part 2", Retrieved From: https://www.cs.princeton.edu/courses/archive/spring16/cos435/Notes/compressionSummaryPart2.pdf, Retrieved on: Jan. 21, 2022, 4 Pages.

"Index Compression", Published by Cambridge University Press, Apr. 1, 2009, pp. 85-107.

Buttcher, et al., "Unaligned Binary Codes for Index Compression in Schema-Independent Text Retrieval Systems", In Technical Report No. CS-2006-40, University of Waterloo, 2006, 10 Pages.

Kotipalli, Radha, "Processing Posting Lists Using OpenCL", In Master's Theses and Graduate Research of SJSU ScholarWorks of Master's Project, vol. 474, May 20, 2016, 69 Pages.

Pibiri, et al., "Techniques for Inverted Index Compression", In Repository of arXiv:1908.10598v2, Aug. 3, 2020, 35 Pages.

Clarke, et al., "Dynamic Inverted Indexes for a Distributed Full-Text Retrieval System", In MultiText Project Technical Report MT 95-01, Feb. 24, 1995, pp. 1-13.

"International Search Report and Written Opinion Issued in PCT Application No. PCT/US2022/051032", dated Apr. 3, 2023, 13 Pages.

\* cited by examiner

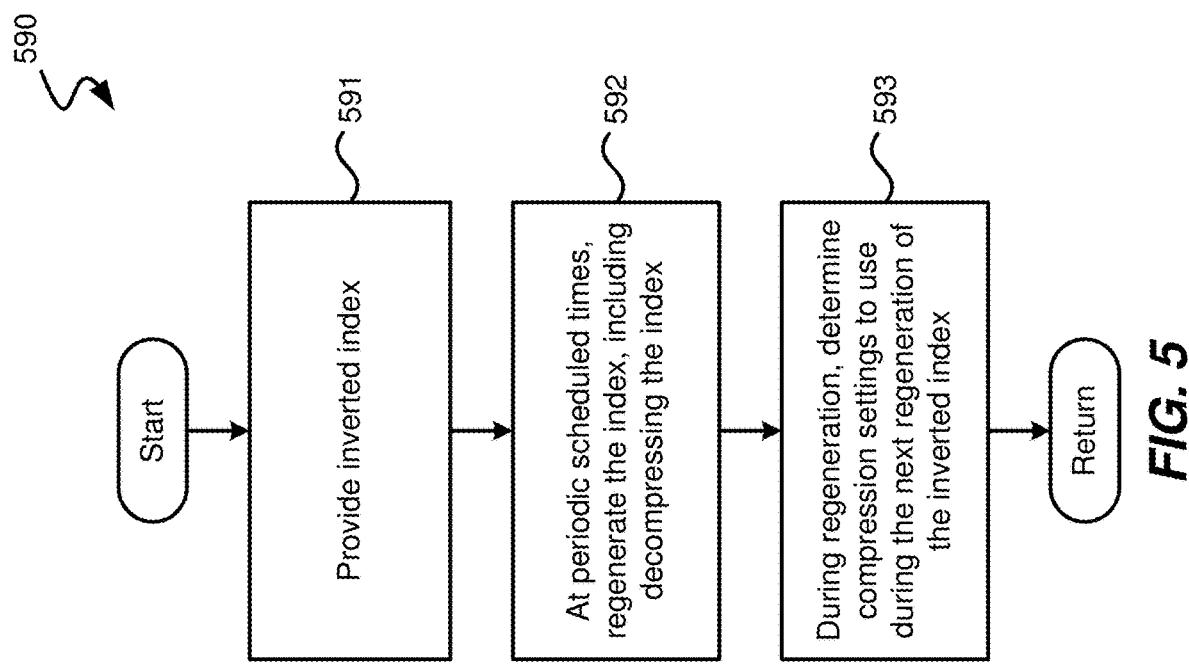

FEEDBACK-BASED INVERTED INDEX COMPRESSION

BACKGROUND

The typical data structure used for free-text search in large volumes of text is an inverted index. Typically, an inverted index is stored and accessed from a mass storage. An inverted index typically uses a disk-based access method and typically consists primarily of a dictionary and a posting file stored on and accessed from a disk-based storage. Typically, the dictionary lists all words available in the index and for each word it stores the location and size of the word in the posting file. In the posting file there is typically a sorted list of all places (document identification and position in document) where the word occurs.

SUMMARY OF THE DISCLOSURE

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Briefly stated, the disclosed technology is generally directed to the compression of inverted indexes and other suitable indexes. In some examples, an inverted index that includes a plurality of posting lists and metadata is provided. In some examples, the inverted index indicates compression settings that are associated with the plurality of posting lists. In some examples, at periodic scheduled times, a regeneration is performed on the inverted index. In some examples, the regeneration includes decompressing the inverted index. In some examples, the decompressing uses the compression settings indicated by the inverted index. In some examples, the regeneration further includes determining compression settings to use during a next periodic scheduled time of the plurality of periodic scheduled times, such that at least a first posting list of the plurality of posting lists uses a different compression setting than a second posting list of the plurality of posting lists.

Other aspects of and applications for the disclosed technology will be appreciated upon reading and understanding the attached figures and description.

BRIEF DESCRIPTION OF THE DRAWINGS

Non-limiting and non-exhaustive examples of the present disclosure are described with reference to the following drawings. In the drawings, like reference numerals refer to like parts throughout the various figures unless otherwise specified. These drawings are not necessarily drawn to scale.

For a better understanding of the present disclosure, reference will be made to the following Detailed Description, which is to be read in association with the accompanying drawings, in which:

FIG. 5 is a flow diagram illustrating an example process for the compression and management of an index, in accordance with aspects of the disclosure.

DETAILED DESCRIPTION

Figure 1:
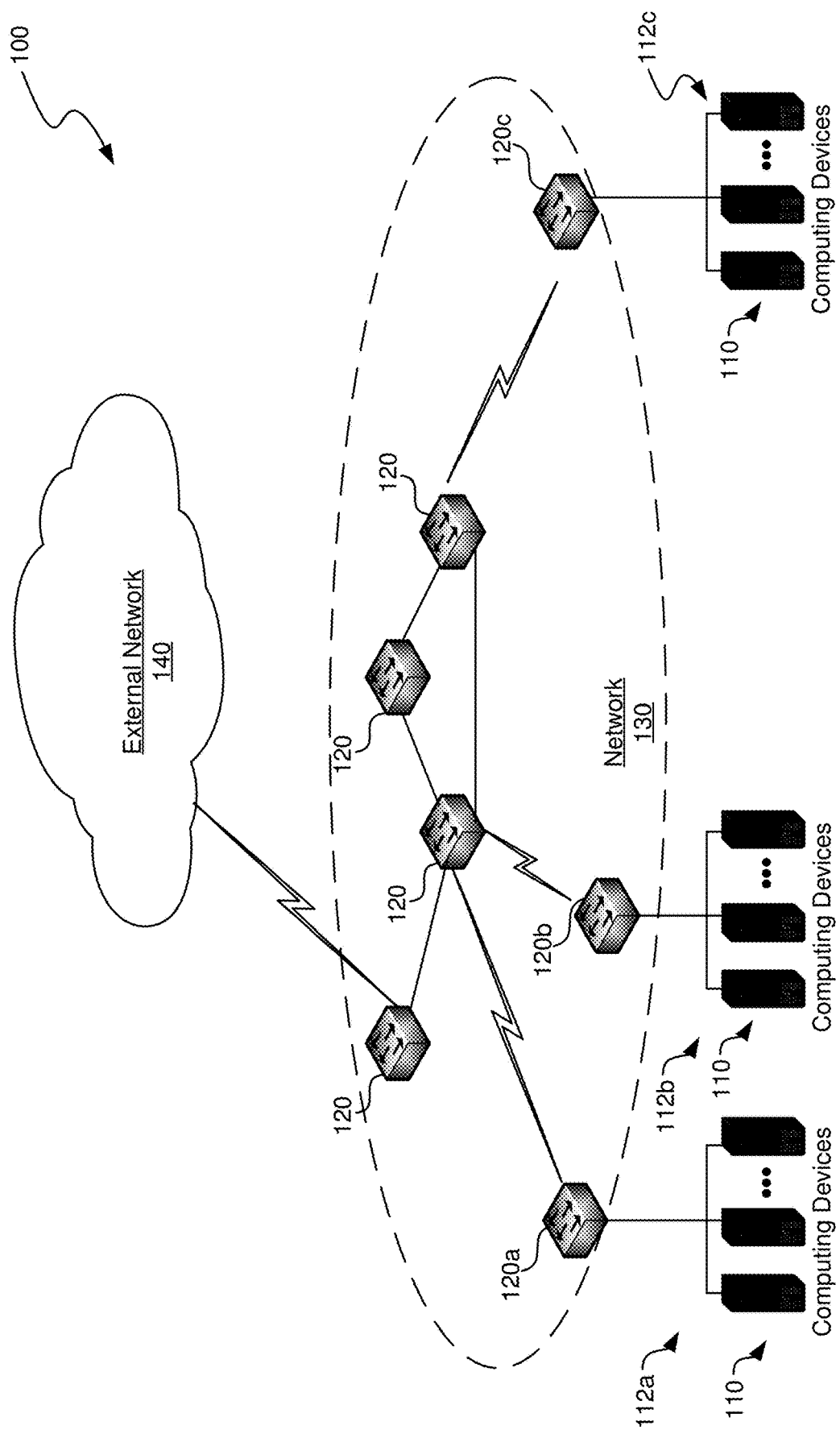
FIG. 1 is a block diagram illustrating one example of a suitable environment in which aspects of the technology may be employed.

The following description provides specific details for a thorough understanding of, and enabling description for, various examples of the technology. One skilled in the art will understand that the technology may be practiced without many of these details. In some instances, well-known structures and functions have not been shown or described in detail to avoid unnecessarily obscuring the description of examples of the technology. It is intended that the terminology used in this disclosure be interpreted in its broadest reasonable manner, even though it is being used in conjunction with a detailed description of certain examples of the technology. Although certain terms may be emphasized below, any terminology intended to be interpreted in any restricted manner will be overtly and specifically defined as such in this Detailed Description section. Throughout the specification and claims, the following terms take at least the meanings explicitly associated herein, unless the context dictates otherwise. The meanings identified below do not necessarily limit the terms, but merely provide illustrative examples for the terms. For example, each of the terms "based on" and "based upon" is not exclusive, and is equivalent to the term "based, at least in part, on," and includes the option of being based on additional factors, some of which may not be described herein. As another example, the term "via" is not exclusive, and is equivalent to the term "via, at least in part," and includes the option of being via additional factors, some of which may not be described herein. The meaning of "in" includes "in" and "on." The phrase "in one embodiment," or "in one example," as used herein does not necessarily refer to the same embodiment or example, although it may. Use of particular textual numeric designators does not imply the existence of lesser-valued numerical designators. For example, reciting "a widget selected from the group consisting of a third foo and a fourth bar" would not itself imply that there are at least three foo, nor that there are at least four bar, elements. References in the singular are made merely for clarity of reading and include plural references unless plural references are specifically excluded. The term "or" is an inclusive "or" operator unless specifically indicated otherwise. For example, the phrases "A or B" means "A, B, or A and B." As used herein, the terms "component" and "system" are intended to encompass hardware, software, or various combinations of hardware and software. Thus, for example, a system or component may be a process, a process executing on a computing device, the computing device, or a portion thereof. The term "cloud" or "cloud computing" refers to shared pools of configurable computer system resources and higher-level services over a wide-area network, typically the Internet. "Edge" devices refer to devices that are not themselves part of the cloud, but are devices that serve as an entry point into enterprise or service provider core networks. The term "document" refers to a sequence of words, tokens, items, properties, or other suitable units of data, where the sequence is capable of being indexed and uniquely identified.

Briefly stated, the disclosed technology is generally directed to the compression of inverted indexes and other suitable indexes. In some examples, an inverted index that includes a plurality of posting lists and metadata is provided. In some examples, the inverted index indicates compression settings that are associated with the plurality of posting lists. In some examples, at periodic scheduled times, a regeneration is performed on the inverted index. In some examples, the regeneration includes decompressing the inverted index. In some examples, the decompressing uses the compression settings indicated by the inverted index. In some examples, the regeneration further includes determining compression settings to use during a next periodic scheduled time of the plurality of periodic scheduled times, such that at least a first posting list of the plurality of posting lists uses a different compression setting than a second posting list of the plurality of posting lists.

In some examples, an inverted index includes a posting list file and metadata, where the metadata may include a dictionary. In some examples, the posting list file includes a separate individual posting list for each word in the indexed documents, where "word" refers to the individual items of data, which may include "words" as commonly understand, and may also include tokens, item, properties, or other suitable units of data whose positions in documents are contained in the inverted index. In some examples, each posting list indicates the documents that include the corresponding word, and also indicates the position of each instance of the word in the document. In some examples, the documents are indicated using a document identifier ("document ID"), where each separate document has a unique document ID that identifies the document. In some examples, due to the size of the inverted index, and for more efficient storage of the inverted index, the inverted index is compressed.

In some examples, when an inverted index is generated, the inverted index includes information about compression settings used for each posting list, so that the compression settings of each of the posting lists may be separately set for each individual posting list. In some examples, the compression setting for each of the posting lists may be included in the header of that posting list. In some examples, the compression settings for each of the posting lists may be included in the metadata of the inverted index, such as in the dictionary of the inverted index. The compression settings may specify various aspects of the compression in various examples. In some examples, the compression settings for a particular posting list may include an indication of which algorithm to use for the compression of the posting list, and the compression settings may further include one or more additional settings to use for that posting list for the particular algorithm indicated.

In this way, in these examples, different posting lists in the inverted index can be compressed by different compression algorithms. In some examples, the same algorithm is used for all of the posting lists in the inverted index, but different compression settings for the algorithm may be used for each posting list. In some examples, the Golomb-Rice2 compression method may be used for compressing some or all of the posting lists, and the compression settings may include the K value used for the Golomb-Rice2 compression, so that each of the individual posting lists has a K value for compression that is individually settable from the K value used for compression of the other posting lists.

In some examples, the inverted index is regenerated on a periodic basis, such as once per week. An inverted index typically cannot be updated. Instead, in some examples, one or more smaller indexes are created as new documents come in, and once per week, a new inverted index is created by merging the previous master inverted index with the new indexes that were created during the intervening week based on new documents received by the indexer. In some examples, the inverted index is regenerated each week regardless of whether new documents were received.

In some examples, each time the index is regenerated, first the index from the previous week is decompressed using the compression settings indicated for the posting lists. During the regeneration process, in some examples, for each posting list, the result of compression with one or more different compression settings is calculated, and then compared with each other and the current compression setting used for the posting list. If it is determined that different compression settings for that posting list provides better compression, then, in some examples, the compression settings for that posting list are updated, to be used during the next regeneration of the inverted index. In some examples, exactly one pass is used to improve the compression settings each time the inverted index is regenerated.

In this way, in some examples, over time, compression of the inverted index is optimized in a feedback-based manner. In some examples, a reduction of about 20% of the compressed lengths relative to standard compression of an inverted index may be achieved.

Illustrative Devices/Operating Environments

FIG. 1 is a diagram of environment 100 in which aspects of the technology may be practiced. As shown, environment 100 includes computing devices 110, as well as network nodes 120, connected via network 130. Even though particular components of environment 100 are shown in FIG. 1, in other examples, environment 100 can also include additional and/or different components. For example, in certain examples, the environment 100 can also include network storage devices, maintenance managers, and/or other suitable components (not shown). Computing devices 110 shown in FIG. 1 may be in various locations, including a local computer, on premise, in the cloud, or the like. For example, computer devices 110 may be on the client side, on the server side, or the like.

As shown in FIG. 1, network 130 can include one or more network nodes 120 that interconnect multiple computing devices 110, and connect computing devices 110 to external network 140, e.g., the Internet or an intranet. For example, network nodes 120 may include switches, routers, hubs, network controllers, or other network elements. In certain examples, computing devices 110 can be organized into racks, action zones, groups, sets, or other suitable divisions. For example, in the illustrated example, computing devices 110 are grouped into three host sets identified individually as first, second, and third host sets 112a-112c. In the illustrated example, each of host sets 112a-112c is operatively coupled to a corresponding network node 120a-120c, respectively, which are commonly referred to as "top-of-rack" or "TOR" network nodes. TOR network nodes 120a-120c can then be operatively coupled to additional network nodes 120 to form a computer network in a hierarchical, flat, mesh, or other suitable types of topology that allows communications between computing devices 110 and external network 140. In other examples, multiple host sets 112a-112c may share a single network node 120. Computing devices no may be virtually any type of general- or specific-purpose computing device. For example, these computing devices may be user devices such as desktop computers, laptop computers, tablet computers, display devices, cameras, printers, or smartphones. However, in a data center environment, these computing devices may be server devices such as application server computers, virtual computing host computers, or file server computers. Moreover, computing devices 110 may be individually configured to provide computing, storage, and/or other suitable computing services.

In some examples, one or more of the computing devices 110 is a device that is configured to be at least part of a process for feedback-based compression of an inverted index or other suitable index with individually adjustable compression settings of the posting lists of the inverted index with potentially new compression settings calculated at each regeneration of the index, using a single pass at each regeneration of the index.

Illustrative Computing Device

Figure 2:
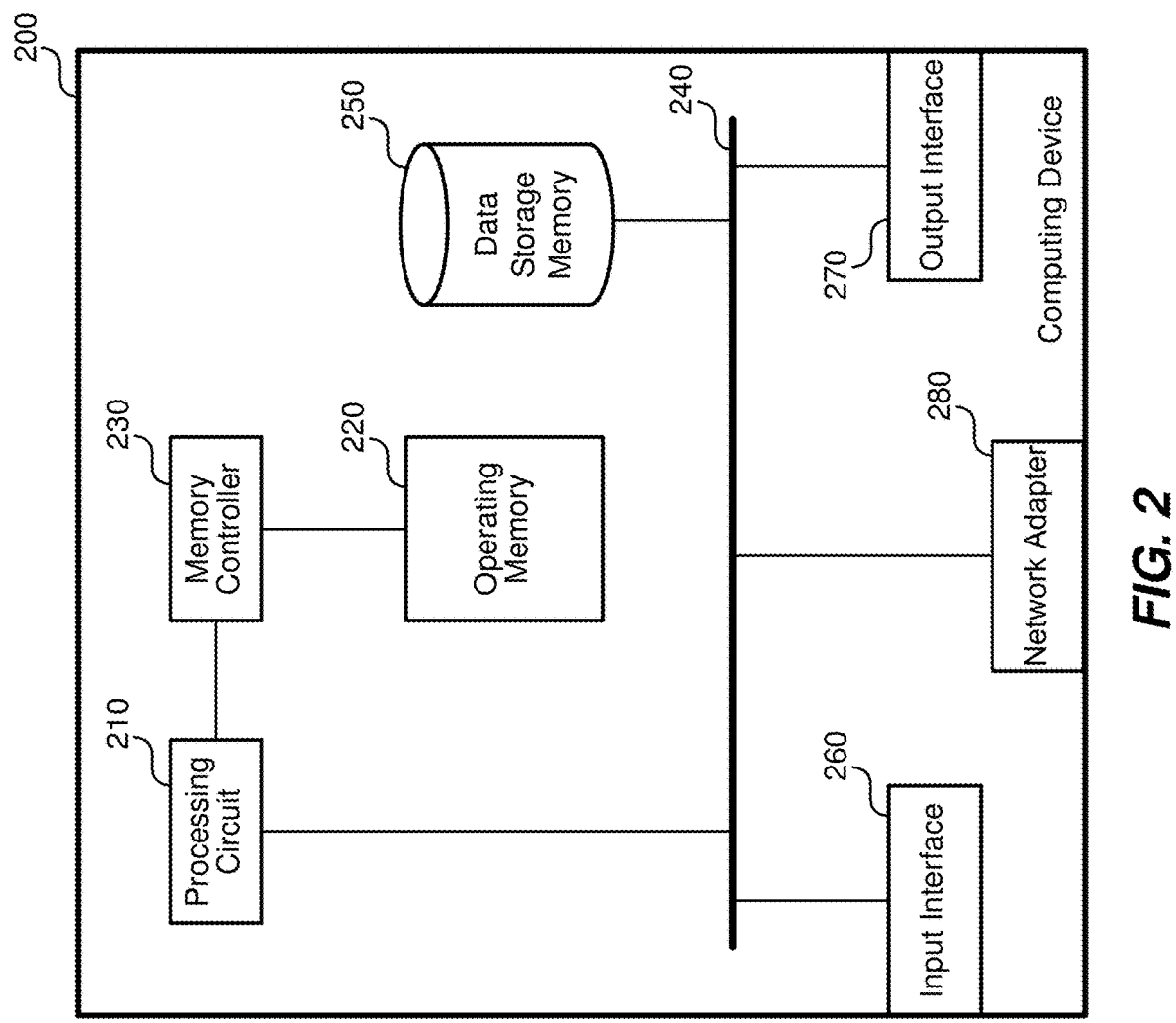
FIG. 2 is a block diagram illustrating one example of a suitable computing device according to aspects of the disclosed technology.

FIG. 2 is a diagram illustrating one example of computing device 200 in which aspects of the technology may be practiced. Computing device 200 may be virtually any type of general- or specific-purpose computing device. For example, computing device 200 may be a user device such as a desktop computer, a laptop computer, a tablet computer, a display device, a camera, a printer, or a smartphone. Likewise, computing device 200 may also be a server device such as an application server computer, a virtual computing host computer, or a file server computer, e.g., computing device 200 may be an example of computing device no or network node 120 of FIG. 1. Likewise, computer device 200 may be an example any of the devices, a device within any of the distributed systems, illustrated in or referred to in any of the following figures, as discussed in greater detail below. As illustrated in FIG. 2, computing device 200 may include processing circuit 210, operating memory 220, memory controller 230, bus 240, data storage memory 250, input interface 260, output interface 270, and network adapter 280. Each of these afore-listed components of computing device 200 includes at least one hardware element.

Computing device 200 includes at least one processing circuit 210 configured to execute instructions, such as instructions for implementing the herein-described workloads, processes, or technology. Processing circuit 210 may include a microprocessor, a microcontroller, a graphics processor, a coprocessor, a field-programmable gate array, a programmable logic device, a signal processor, or any other circuit suitable for processing data. The aforementioned instructions, along with other data (e.g., datasets, metadata, operating system instructions, etc.), may be stored in operating memory 220 during run-time of computing device 200. Operating memory 220 may also include any of a variety of data storage devices/components, such as volatile memories, semi-volatile memories, random access memories, static memories, caches, buffers, or other media used to store run-time information. In one example, operating memory 220 does not retain information when computing device 200 is powered off. Rather, computing device 200 may be configured to transfer instructions from a non-volatile data storage component (e.g., data storage component 250) to operating memory 220 as part of a booting or other loading process. In some examples, other forms of execution may be employed, such as execution directly from data storage component 250, e.g., eXecute In Place (XIP).

Operating memory 220 may include 4th generation double data rate (DDR4) memory, 3rd generation double data rate (DDR3) memory, other dynamic random access memory (DRAM), High Bandwidth Memory (HBM), Hybrid Memory Cube memory, 3D-stacked memory, static random access memory (SRAM), magnetoresistive random access memory (MRAM), pseudorandom random access memory (PSRAM), or other memory, and such memory may comprise one or more memory circuits integrated onto a DIMM, SIMM, SODIMM, Known Good Die (KGD), or other packaging. Such operating memory modules or devices may be organized according to channels, ranks, and banks. For example, operating memory devices may be coupled to processing circuit 210 via memory controller 230 in channels. One example of computing device 200 may include one or two DIMMs per channel, with one or two ranks per channel. Operating memory within a rank may operate with a shared clock, and shared address and command bus. Also, an operating memory device may be organized into several banks where a bank can be thought of as an array addressed by row and column. Based on such an organization of operating memory, physical addresses within the operating memory may be referred to by a tuple of channel, rank, bank, row, and column.

Despite the above-discussion, operating memory 220 specifically does not include or encompass communications media, any communications medium, or any signals per se.

Memory controller 230 is configured to interface processing circuit 210 to operating memory 220. For example, memory controller 230 may be configured to interface commands, addresses, and data between operating memory 220 and processing circuit 210. Memory controller 230 may also be configured to abstract or otherwise manage certain aspects of memory management from or for processing circuit 210. Although memory controller 230 is illustrated as single memory controller separate from processing circuit 210, in other examples, multiple memory controllers may be employed, memory controller(s) may be integrated with operating memory 220, or the like. Further, memory controller(s) may be integrated into processing circuit 210. These and other variations are possible.

In computing device 200, data storage memory 250, input interface 260, output interface 270, and network adapter 280 are interfaced to processing circuit 210 by bus 240. Although FIG. 2 illustrates bus 240 as a single passive bus, other configurations, such as a collection of buses, a collection of point-to-point links, an input/output controller, a bridge, other interface circuitry, or any collection thereof may also be suitably employed for interfacing data storage memory 250, input interface 260, output interface 270, or network adapter 280 to processing circuit 210.

In computing device 200, data storage memory 250 is employed for long-term non-volatile data storage. Data storage memory 250 may include any of a variety of non-volatile data storage devices/components, such as non-volatile memories, disks, disk drives, hard drives, solid-state drives, or any other media that can be used for the non-volatile storage of information. However, data storage memory 250 specifically does not include or encompass communications media, any communications medium, or any signals per se. In contrast to operating memory 220, data storage memory 250 is employed by computing device 200 for non-volatile long-term data storage, instead of for run-time data storage.

Also, computing device 200 may include or be coupled to any type of processor-readable media such as processor-readable storage media (e.g., operating memory 220 and data storage memory 250) and communication media (e.g., communication signals and radio waves). While the term processor-readable storage media includes operating memory 220 and data storage memory 250, the term "processor-readable storage media," throughout the specification and the claims whether used in the singular or the plural, is defined herein so that the term "processor-readable storage media" specifically excludes and does not encompass communications media, any communications medium, or any signals per se. However, the term "processor-readable storage media" does encompass processor cache, Random Access Memory (RAM), register memory, and/or the like.

Computing device 200 also includes input interface 260, which may be configured to enable computing device 200 to receive input from users or from other devices. In addition, computing device 200 includes output interface 270, which may be configured to provide output from computing device 200. In one example, output interface 270 includes a frame buffer, graphics processor, graphics processor or accelerator, and is configured to render displays for presentation on a separate visual display device (such as a monitor, projector, virtual computing client computer, etc.). In another example, output interface 270 includes a visual display device and is configured to render and present displays for viewing. In yet another example, input interface 260 and/or output interface 270 may include a universal asynchronous receiver/transmitter (UART), a Serial Peripheral Interface (SPI), Inter-Integrated Circuit (I2C), a General-purpose input/output (GPIO), and/or the like. Moreover, input interface 260 and/or output interface 270 may include or be interfaced to any number or type of peripherals.

In the illustrated example, computing device 200 is configured to communicate with other computing devices or entities via network adapter 280. Network adapter 280 may include a wired network adapter, e.g., an Ethernet adapter, a Token Ring adapter, or a Digital Subscriber Line (DSL) adapter. Network adapter 280 may also include a wireless network adapter, for example, a Wi-Fi adapter, a Bluetooth adapter, a ZigBee adapter, a Long-Term Evolution (LTE) adapter, SigFox, LoRa, Powerline, or a 5G adapter.

Although computing device 200 is illustrated with certain components configured in a particular arrangement, these components and arrangements are merely one example of a computing device in which the technology may be employed. In other examples, data storage memory 250, input interface 260, output interface 270, or network adapter 280 may be directly coupled to processing circuit 210, or be coupled to processing circuit 210 via an input/output controller, a bridge, or other interface circuitry. Other variations of the technology are possible.

Some examples of computing device 200 include at least one memory (e.g., operating memory 220) having processor-executable code stored therein, and at least one processor (e.g., processing unit 210) that is adapted to execute the processor-executable code, wherein the processor-executable code includes processor-executable instructions that, in response to execution, enables computing device 200 to perform actions, where the actions may include, in some examples, actions for one or more processes described herein, such as the process shown in FIG. 5, as discussed in greater detail below.

Illustrative Systems

Figure 3:
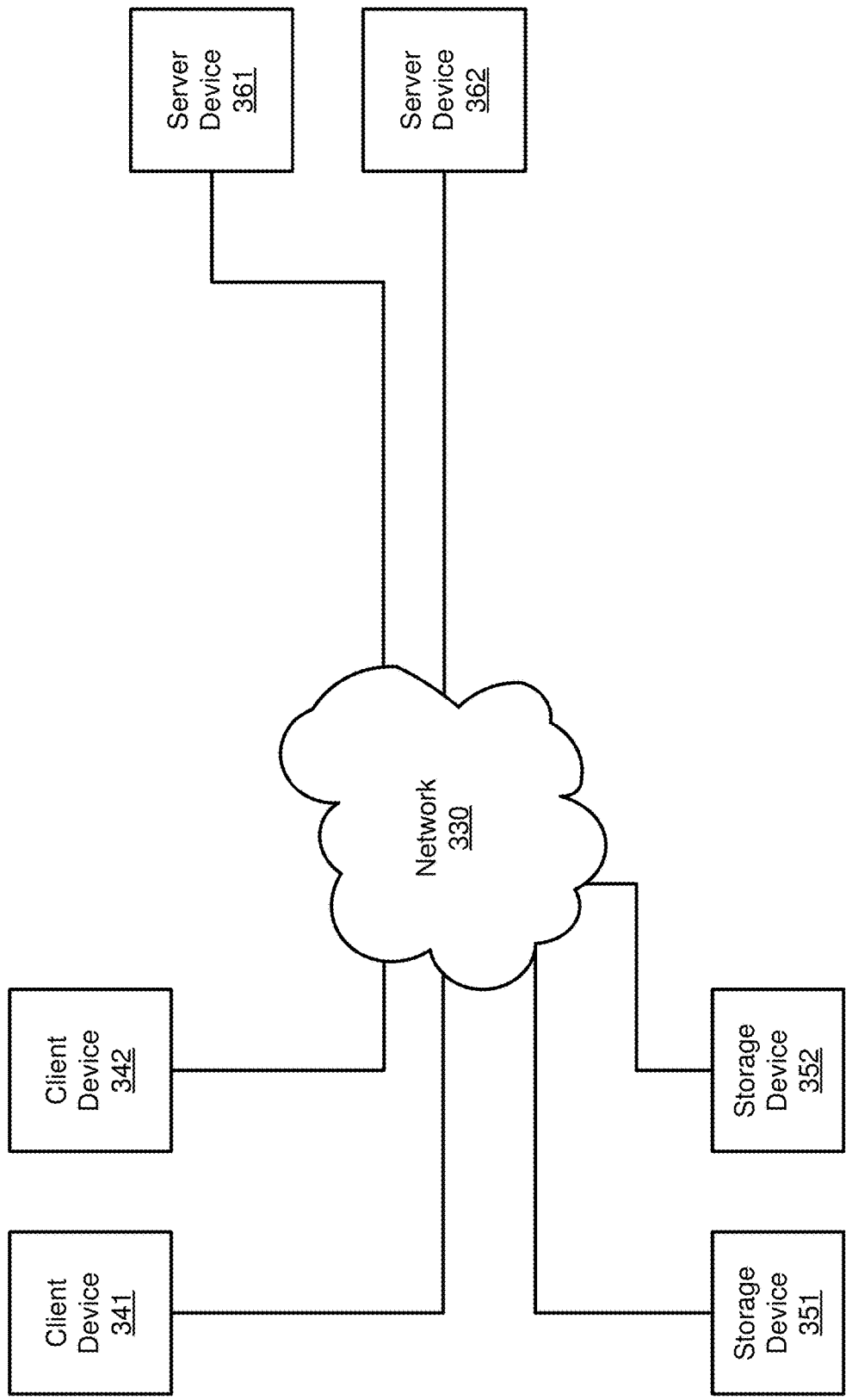
FIG. 3 is a block diagram illustrating an example of a network-connected system.

FIG. 3 is a block diagram illustrating an example of a system (300). System 300 may include network 330, as well as client devices 341 and 342; storage devices 351 and 352; and server devices 361 and 362, which, in some examples, all connect to network 330.

Each of client devices 341 and 342; storage devices 351 and 352; and server devices 361 and 362 may include examples of computing device 200 of FIG. 2. FIG. 3 and the corresponding description of FIG. 3 in the specification illustrate an example system for illustrative purposes that does not limit the scope of the disclosure. In some examples, server devices 361 and 362 are part of one or more distributed systems.

In some examples, storage devices 351 and 352 provide storage, including mass storage in which documents may be stored, and in which an index for the stored documents may be stored. In some examples, service devices 361 and 362 may be part of a distributed system that controls a search engine that makes use of one or more indexes that may be stored on storage devices such as storage devices 361 and 362. In some examples, client devices 341 and 342 may provide documents to be stored on storage devices (e.g., 351 and 352), and may communicate with the server devices (e.g., 361 and 362) to make use of the search engine, such as by making search queries. In some examples, the search engine may be a multi-tenant search engine, and client devices 341 and 341 may belong to different tenants.

Network 330 may include one or more computer networks, including wired and/or wireless networks, where each network may be, for example, a wireless network, local area network (LAN), a wide-area network (WAN), and/or a global network such as the Internet. On an interconnected set of LANs, including those based on differing architectures and protocols, a router acts as a link between LANs, enabling messages to be sent from one to another. Also, communication links within LANs typically include twisted wire pair or coaxial cable, while communication links between networks may utilize analog telephone lines, full or fractional dedicated digital lines including T1, T2, T3, and T4, Integrated Services Digital Networks (ISDNs), Digital Subscriber Lines (DSLs), wireless links including satellite links, or other communications links known to those skilled in the art. Furthermore, remote computers and other related electronic devices could be remotely connected to either LANs or WANs via a modem and temporary telephone link. Network 330 may include various other networks such as one or more networks using local network protocols such as 6LoWPAN, ZigBee, or the like. In essence, network 330 may include any suitable network-based communication method by which information may travel among client devices 341 and 342; storage devices 351 and 352; and server devices 361 and 362. Although each device is shown connected as connected to network 330, that does not necessarily mean that each device communicates with each other device shown. In some examples, some devices shown only communicate with some other devices/services shown via one or more intermediary devices. Also, although network 330 is illustrated as one network, in some examples, network 330 may instead include multiple networks that may or may not be connected with each other, with some of the devices shown communicating with each other through one network of the multiple networks and other of the devices shown instead communicating with each other with a different network of the multiple networks. In some examples, client devices 341 and 342 do not communicate with storage devices 351 and 352 directly, but instead can communicate with storage devices 351 and 352 through server devices such as server device 361 and server device 362.

System 300 may include more or less devices than illustrated in FIG. 3, which is shown by way of example only.

In some examples, storage devices, such as storage devices 351 and 352, store documents, and store an index for the documents. The index may be an inverted index or other suitable index. In some examples, the storage is multi-tenant, and document storage and the corresponding index is managed separately for separate tenants.

In some examples, for at least one index stored on the storage devices, the compression settings for each of the posting lists may be included in the index. The compression settings may specify various aspects of the compression. In some examples, the compression settings for a particular posting list may include an indication of which compression scheme/algorithm to use for the compression of the posting list, and the compression settings may further include additional settings for the particular compression scheme indicated. In this way, in these examples, different posting lists in the index can be compressed by different compression schemes/algorithms.

In some examples, the same compression scheme is used for all of the posting lists in the index, but different compression settings for the compression scheme may be used for each posting list. In some examples, the Golomb-Rice2 compression method may be used for compressing some or all of the posting lists, and the compression settings may include the K value used for the Golomb-Rice2 compression, so that each of the individual posting lists has a K value for compression that is individually settable from the K value used for compression of the other posting lists. Because each of the posting lists has a K value for compression that is individually settable from the K value used for compression of the other postings lists, after the K value of each of the posting lists is adjusted by the feedback loop, different posting lists may have different K values used for the compression of that posting list than other posting lists.

In some examples, new documents may be received by the server devices (e.g., server devices 361 and 362) from various sources, including, for example, client devices 341 and 342. In some examples, the new documents are stored by the storage devices, and one or more additional indexes are created for the new documents. In some examples, the search engine controlled by server devices (e.g., service device 361 and 362) causes the inverted index to be regenerated on a scheduled periodic basis, such as once per week. In some examples, in addition to the inverted index from the last time period, any new indexes created based on newly received documents are also included when regenerating the inverted index.

In some examples, each time the inverted index is regenerated by the server devices, first the inverted index from the previous week is decompressed using the compression settings indicated for the posting lists. During the regeneration process, in some examples, for each posting list, the result of compression of that posting list with one or more different compression settings is calculated, and then compared with each other and the current compression setting used for the posting list. If it is determined by the server devices that different compression settings for that posting list provides better compression, then, in some examples, the compression settings for that posting list are updated, to be used during the next regeneration of the inverted index. In some examples, exactly one pass is used to improve the compression settings each time the inverted index is regenerated.

Although an online index is discussed above with regard to system 300 of FIG. 3, other examples of system 300 use an on-premise index, allowing for a search of on-premise documents.

Figure 4:
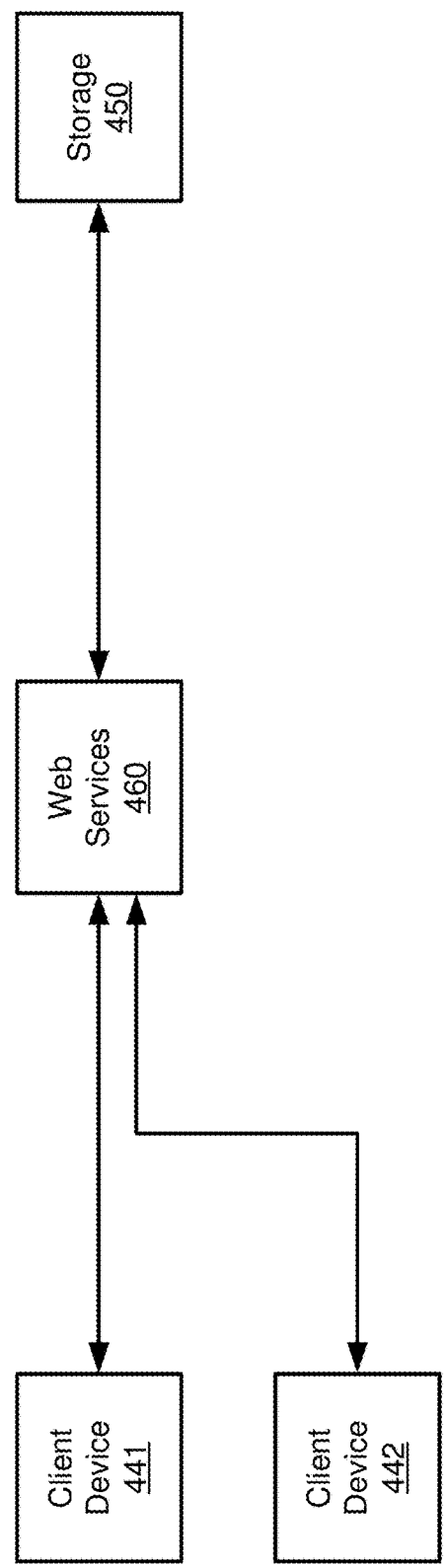
FIG. 4 is a block diagram illustrating an example of a system for the compression and management of an index.

FIG. 4 is a block diagram illustrating an example of a system (400). System 400 may be an example of a portion of system 300 of FIG. 3. System 400 may be a system for the compression and management of an inverted index. System 400 may include client device 441, client device 442, storage 450, and web services 460. Client devices 441 and 442 may be examples of client devices 341 and 342 of FIG. 2. In some examples, web services 460 may include one or more devices (which may be examples of server devices 361 and 362 of FIG. 3) and/or one or more distributed systems. In some examples, storage 450 may include one or more storage devices, which may be examples of storage devices 351 and 352 of FIG. 3. In some examples, storage 450 is disk storage. In other examples, storage 450 may use other suitable forms of storage.

In some examples, web services 460 includes a multi-tenant document storage/management service and multi-tenant search engine service on behalf of clients, where the clients may communicate via client devices such as client devices 441 and 442. Web services 460 may include a search engine that includes an indexer. Web services 460 may receive document from various sources, including, for example, client devices 441 and 442. When new documents are received, the new documents may be processed by the indexer, and then stored in storage 450.

In some examples, when web services 460 initially receives documents, the documents are broken up into words and fed to the index, and the index creates an inverted index based on the documents processed. The inverted index may then be compressed and stored in storage 450. In some examples, each inverted index includes a dictionary and a posting file, where the posting file includes a number of posting lists—one posting list per word. In some examples, each posting list is a list of integers, where the integers identify, via one or more document IDs, each document in which that word appears, and indicates where each instance of that word appears in each of the identified documents. In some examples, the dictionary includes a binary tree of each of the words that points to the posting list for that word. In some examples, the dictionary may also indicate one or more additional properties for each of the posting lists.

In some examples, the inverted index is compressed in such a way that different algorithms may be used for the compression of different posting lists in the inverted index, with the Golomb-Rice2 compression scheme being one of the available algorithms for compression. In some examples, one or more suitable compression schemes other than the Golomb-Rice2 compression scheme are used. In some examples, the inverted index indicates, for each posting list, which algorithm and setting should be used for the compression of that posting list. For instance, in some examples, each posting list has a header that identifies the algorithm and setting used. In some examples, if the Golomb-Rice2 compression scheme is the indicated algorithm for compression of a posting list, then the header of that posting list identifies the Golomb-Rice2 compression scheme, and the indicated compression settings for the posting list also include the K value to use for the Golomb-Rice compression of that posting list.

In some examples, the algorithms that may be used for compression of the posting lists fall into two categories: (1) Arithmetic-based compression such as Golomb-Rice2; and (2) other class of variable byte integers such as VarInt of C #. Posting lists having certain characteristics may compress significantly better with an algorithm of the first category than the second category, and posting lists having certain other characteristics may compress significantly better than an algorithm of the second category than with an algorithm of the first category.

The Golomb-Rice2 compression scheme works as follows. The Golomb-Rice2 compression scheme is an arithmetic coding that divides an integer into a quotient and remainder and with the remainder of a fixed width and the quotient represented in unary form. The divisor is called the K value. If the integers are relatively small, the K value can be chosen so that the remainder is represented by relatively few bits and using a relatively small number of bits for the quotient.

Web services 460 may provide a multi-tenant search engine, for which tenants may use a client device (e.g., client device 441 or 442) to make a search query to web services 460 so that web services 460 may then perform a search for documents stored in storage 450. When the multi-tenant search engine receives a search query, the multi-tenant search engine may access and use the inverted index for the search. Web services 460 may then communicate the results of the search back to the requestor that made the search query.

When the initial inverted index is first compressed, suitable default settings are used for the compression settings in some examples. The compression settings may be subsequently changed each time the inverted index is regenerated, using a single pass each time the inverted index is regenerated. In some examples, the re-indexing occurs based on times that are scheduled to occur in a regular, periodic manner. For instance, in some examples, the inverted index is scheduled to be regenerated once per week. In other examples, the inverted index is regenerated based on a suitable regular time interval other than once a week.

Documents may continue to be received and stored in storage 450 between regenerations of the inverted index. In some examples, these documents are indexed in separate indexes that are smaller than the inverted index. When the inverted index is regenerated, in some examples, any other indexes created based on documents stored since the last index are merged into the master inverted index as part of the regeneration of the inverted index.

Each time the inverted index is regenerated, in some examples, the inverted index, as well as any other indexes being merged, are decompressed. When decompressing the inverted index, for each posting list, in some examples, the indicated compression settings are determined based on the compression settings in the header, and the determined compression settings are used for decompressing the posting. After the inverted index is decompressed, in some examples, the inverted index is generated again, using the inverted index from the previous regeneration, in addition to merging any new indexes, and the re-generated index is compressed.

While performing the regeneration, the indexer also tests additional compression settings as follows in some examples. For each posting list, the indexer calculates the length of what the compressed posting list would be using different compression settings, and determining the best compression based on the different compression settings calculated. If the calculated length of the posting list for any of the compression settings is less than the calculated length for the last compression settings used to compress the inverted index, then the compression settings for the posting list indicate the better compression settings, which will be used to compress the posting list during the next regeneration of the inverted index. In some examples, the header of the posting list stores both an indication of the compression settings currently used to compress the current generation of the inverted index—so that these compression settings can be used to decompress the inverted index—and the compression settings to use the next time that the inverted index is regenerated.

In some examples, all of the posting lists use the Golomb-Rice2 compression scheme, and the regeneration testing of the additional compression settings is performed as follows. In some examples, a code plugin system/architecture allows the settings to be used for compression and decompression (such as, for example, the K value of the Golomb-Rice compression scheme) to be individually set for each posting list, and to be adjusted or not adjusted at each regeneration based on feedback. In some examples, the inverted index includes a dictionary, where the dictionary entry for each word includes a single bit that is set if the associated posting list has a non-default compression. In some examples, each posting list has a header that includes the current K value that was used in the Golomb-Rice compression of that posting list. When the posting list is decompressed, the current K value may be used to perform decompression. In some examples, the header also includes a field that indicates whether, during the regeneration of the index, the K value should be incremented, decremented, or left the same. In some examples, as part of the regeneration of the index, the index is compressed, and the compression using the new K values, including, for each posting list, using the K value that is incremented, decrementing, or left the same as the K value used in decompressing the index.

In some examples, the search engine is designed with efficient code that allows run-time dispatching to the code so that each posting list can be decompressed with the proper K value. In some examples, the efficient code uses virtual function dispatching and is further optimized by templated versions of all compression K values. In some examples, there is a single API that is used to decompress a value given a K value as an argument.

Also, after the inverted index has been regenerated and compressed, in some examples, for each posting list, a determination is made as to whether the K value should be incremented, decremented, or left the same during the next regeneration of the inverted index. In some examples, the determination is made using the plugin architecture to invoke a static analyzer. In some examples, the static analyzer calculates the lengths of the compressed integers for the new posting list using the settings for K−1, K, K+1 and individually summed. In some examples, if any of the two summed lengths (K−1 and K+1) are shorter than for the current K, then, then that increment or decrement is determined to lead to a better compression ratio, and the K value is incremented or decremented accordingly for use during the next regeneration. In some examples, use of the plugin architecture allows future modifications to be made to the static analyzer.

In some examples, for avoiding excessive overhead, the posting list header will only be embedded if the posting list is of such a length that the overhead does not lead to increased posting list size. In some examples, this may be accomplished using the bit in the dictionary entry for the given posting list. Accordingly, in some examples, in the header of each posting list, the K value and the field that indicates whether the K value should be incremented, decremented, or left the same is updated based on this determination for the posting list.

The same process may be repeated over time, with a new regeneration of the inverted index occurring each week, or other suitable regular time interval. In some examples, using this scheme allows the compression settings over time via a feedback loop to settle for the best settings for a given posting list. In this way, determination of optimal compressor settings may be automated using feedback from the previous generation of the inverted index. This allows the compression to be optimized over time, as well as updated over time based on new documents received. Because in some examples only K−1, K, K+1 length is calculated and no extra pass is added, the cost of optimizing the compression settings is substantially negligible and does not substantially increase the cost of index re-generation. In some examples, lightweight analysis of posting lists is used and the outcome of the analysis is recorded in the header and used that as input for the next generation of the index.

In some examples, the compression is optimized primarily based on efficiency of the compression—that is, for minimizing the storage required for the compressed index. However, in some examples, optimization of the compression may be based on speed of decompression of the compressed index, speed of compression of the index, and/or other suitable factors. Optimizing based on speed, or some combination of speed, storage, and/or other suitable factors, may be achieved by following the same process described above, except by using those factors to determine whether and how to adjust the compression settings each time the index is regenerated.

Although the Golomb-Rice2 compression scheme is discussed above, in other examples, other algorithms may be used in addition to or instead of Golomb-Rice2, and the compression settings the algorithm used may be adjusted. Also, as discussed above, adjusting the compression settings may include adjusting the algorithm used for each posting list on a posting-list-by-posting-list basis. Also, although a multi-tenant search engine was discussed above, various suitable applications other than multi-tenant search engines may be used in various other examples, such as various suitable uses of inverted indexes and other suitable indexes, including online uses and on-premise uses.

Illustrative Processes

FIG. 5 a diagram illustrating an example dataflow for a process (590) for the compression and management of an inverted index. In some examples, process 590 may be performed by an example of one or more server devices 361 and/or 362 of FIG. 3, by an example of web service 460 of FIG. 4, by an example of one or more of device 200 of FIG. 2, or the like.

In the illustrated example, step 591 occurs first. At step 591, in some examples, an inverted index that includes a plurality of posting lists and metadata is provided. In some examples, the inverted index indicates compression settings that are associated with the plurality of posting lists. As shown, steps 592-593 occur next in some examples. At steps 592-593, in some examples, at periodic scheduled times, a regeneration is performed on the inverted index. As shown, step 592 occurs next in some examples. At step 592, in some examples, the inverted index is decompressed. In some examples, the decompressing uses the compression settings indicated by the inverted index.

As shown, step 593 occurs next in some examples. At step 593, in some examples, compression settings to use during a next periodic scheduled time of the plurality of periodic scheduled times are determined, such that at least a first posting list of the plurality of posting lists uses a different compression setting than a second posting list of the plurality of posting lists. The process may then advance to a return block, where other processing is resumed.

CONCLUSION

While the above Detailed Description describes certain examples of the technology, and describes the best mode contemplated, no matter how detailed the above appears in text, the technology can be practiced in many ways. Details may vary in implementation, while still being encompassed by the technology described herein. As noted above, particular terminology used when describing certain features or aspects of the technology should not be taken to imply that the terminology is being redefined herein to be restricted to any specific characteristics, features, or aspects with which that terminology is associated. In general, the terms used in the following claims should not be construed to limit the technology to the specific examples disclosed herein, unless the Detailed Description explicitly defines such terms. Accordingly, the actual scope of the technology encompasses not only the disclosed examples, but also all equivalent ways of practicing or implementing the technology.

We claim:

1. An apparatus, comprising:
a device including at least one memory having processor-executable code stored therein, and at least one processor that is adapted to execute the processor-executable code, wherein the processor-executable code includes processor-executable instructions that, in response to execution, enable the device to perform actions, including:
providing an inverted index that includes a plurality of posting lists and metadata, wherein the inverted index indicates compression settings that are associated with the plurality of posting lists;
at plurality of periodic scheduled times, performing a regeneration on the inverted index, the regeneration including:
decompressing the inverted index, wherein the decompressing uses the compression settings indicated by the inverted index; and
altering compression settings that are used during a next periodic scheduled time of the plurality of periodic scheduled times, such that at least a first posting list of the plurality of posting lists uses a different compression setting than a second posting list of the plurality of posting lists.

2. The apparatus of claim 1, wherein determining the compression settings to use during the next periodic scheduled time includes determining which compression scheme of a plurality of compression schemes to use to compress the posting list during the next periodic scheduled time.

3. The apparatus of claim 1, wherein determining the compression settings to use during the next periodic scheduled time includes determining a K value of a Rice-Golomb2 compression scheme to use to compress the posting list during the next periodic scheduled time.

4. The apparatus of claim 1, wherein performing the regeneration on the inverted index includes merging the inverted index with at least one additional index.

5. The apparatus of claim 1, wherein the inverted index indicates, for each posting list of the plurality of posting lists, compression settings of that posting list, such that the compression settings of each of the posting lists is individually selectable.

6. The apparatus of claim 5, wherein determining compression settings to use during the next periodic scheduled time of the plurality of periodic scheduled times includes determining, for each posting list of the plurality of posting lists, compression settings to use for that posting list during the next periodic scheduled time.

7. The apparatus of claim 5, wherein determining compression settings to use during the next periodic scheduled time of the plurality of periodic scheduled times includes determining, for each posting list of the plurality of posting lists, compression settings to use for that posting list during the next periodic scheduled time by testing a plurality of compression settings for that posting list and selecting the compression settings based on the compression settings that provide a best compression based on at least one of storage space of the compressed posting list, a speed of compressing the posting list, or a speed of decompressing the posting list.

8. The apparatus of claim 5, wherein determining compression settings to use during the next periodic scheduled time of the plurality of periodic scheduled times includes determining, for each posting list of the plurality of posting lists, whether a K value of a Rice-Golom13 compression scheme to use to compress that posting list during the next periodic scheduled time should be incremented by one, decremented by one, or left unchanged.

9. The apparatus of claim 8, wherein for each posting list of the plurality of posting lists, determining whether the K value of the Rice-Golom13 compression scheme to use to compress that posting list during the next periodic scheduled time should be incremented by one, decremented by one, or left unchanged is accomplished by selecting from among the actions of incrementing the K value by one, decrementing the K value by one, or leaving the K value unchanged based on which of the actions, upon compression of the posting list using that K value, would cause the compressed posting list to have a shortest length.

10. A method, comprising:
at each scheduled time of a plurality of scheduled times, performing a regeneration on an index, wherein the index indicates compression settings that are associated with a plurality of posting lists, and wherein the regeneration includes:
decompressing the index, wherein the decompressing uses the compression settings indicated by the index; and
via a processor, altering compression settings that are used a next scheduled time of the plurality of scheduled times, such that at least a first posting list of the plurality of posting lists uses a different compression setting than a second posting list of the plurality of posting lists.

11. The method of claim 10, wherein the index is an inverted index.

12. The method of claim 10, wherein performing the regeneration on the index includes merging the index with at least one additional index.

13. The method of claim 10, wherein the index indicates, for each posting list of the plurality of posting lists, compression settings of that posting list, such that the compression settings of each of the posting lists is individually selectable.

14. The method of claim 13, wherein determining compression settings to use during the next scheduled time of the plurality of scheduled times includes determining, for each posting list of the plurality of posting lists, compression settings to use for that posting list during the next scheduled time of the plurality of scheduled times.

15. The method of claim 13, wherein determining compression settings to use during the next scheduled time of the plurality of scheduled times includes determining, for each posting list of the plurality of posting lists, determining whether a K value of a Rice-Golom13 compression scheme to use to compress that posting list during the next scheduled time should be incremented by one, decremented by one, or left unchanged.

16. A processor-readable storage medium, having stored thereon processor-executable code that, upon execution by at least one processor, enables actions, comprising:
accessing an index that includes a plurality of posting lists and metadata, wherein the index indicates compression settings that are associated with the plurality of posting lists;
at predetermined times, regenerating the index, the regenerating including:
decompressing the index, wherein the decompressing uses the compression settings indicated by the index; and
altering compression settings that are used a next predetermined time of the predetermined times, such that at least a first posting list of the plurality of posting lists uses a different compression setting than a second posting list of the plurality of posting lists.

17. The processor-readable storage medium of claim 16, wherein the index is an inverted index.

18. The processor-readable storage medium of claim 16, wherein regenerating the index includes merging the index with at least one additional index.

19. The processor-readable storage medium of claim 16, wherein the index indicates, for each posting list of the plurality of posting lists, compression settings of that posting list, such that the compression settings of each of the posting lists is individually selectable.

20. The processor-readable storage medium of claim 19, wherein determining compression settings to use during the next predetermined time of the predetermined times includes determining, for each posting list of the plurality of posting lists, compression settings to use for that posting list during the next predetermined time of the predetermined times.

* * * * *